United States Patent [19]

Müller et al.

[11] 4,211,924

[45] Jul. 8, 1980

[54] TRANSMISSION-TYPE SCANNING CHARGED-PARTICLE BEAM MICROSCOPE

[75] Inventors: Karl-Heinz Müller; Burkhard Krisch; Volker Rindfleisch; Hans F. R. Neuendorff, all of Berlin, Fed. Rep. of Germany

[73] Assignee: Siemens Aktiengesellschaft, Berlin and Munich, Fed. Rep. of Germany

[21] Appl. No.: 7,647

[22] Filed: Jan. 29, 1979

Related U.S. Application Data

[63] Continuation of Ser. No. 827,027, Aug. 23, 1977, abandoned.

[30] Foreign Application Priority Data

Sep. 3, 1976 [DE] Fed. Rep. of Germany ....... 2640260

[51] Int. Cl.² .......................................... G01M 23/00
[52] U.S. Cl. .................................... 250/311; 250/398
[58] Field of Search .......................................... 250/311

[56] References Cited

U.S. PATENT DOCUMENTS 4,099,055  7/1978  Todokoro ............................ 250/311

Primary Examiner—Harold A. Dixon
Attorney, Agent, or Firm—Kenyon & Kenyon

[57] ABSTRACT

An improved transmission-type, scanning charged-particle beam microscope including a television camera tube and a television display tube for generating and displaying a diffraction image of a specimen to be examined. The improvement of the invention comprises the provision of a transparent fluorescent screen disposed in the ray cone of the beam behind the specimen along the beam path in the microscope, light-optical means adapted for imaging the fluorescent screen on a target of the television camera tube, and detector means for integrally detecting radiation emanating from the fluorescent screen.

9 Claims, 3 Drawing Figures

TRANSMISSION-TYPE SCANNING CHARGED-PARTICLE BEAM MICROSCOPE

This is a continuation of application Ser. No. 827,027 filed Aug. 23, 1977, now abandoned.

BACKGROUND OF THE INVENTION

1. Field of the Invention

The present invention relates to a transmission-type, scanning charged-particle beam microscope which includes a television camera tube and a television display tube for generating and displaying a diffraction image of a specimen to be examined.

2. Description of the Prior Art

Transmission-type, scanning electron microscopes in which pictorial display of the diffraction image is achieved by use of a television camera tube and a television monitor tube synchronized with the camera tube are known in the art. See, for example, U.S. Pat. No. 3,849,647. Due to the storage characteristic of the target of the television camera tube, the camera tube and the monitor tube comprise a parallel-operating detector system by means of which the entire diffraction image can be simultaneously detected. Such detector systems produce substantially better signal-to-noise ratios than the otherwise customary detection systems in which the diffraction image is sequentially scanned and displayed by a detector. If the scanning frequency of the television camera tube is high relative to the field frequency, diffraction images of the areas which are permeated during scanning are produced. However, if the scanning frequency of the television camera tube is approximately equal to the field frequency, a superposition of many partial diffraction images of the scanned area is produced on the television monitor tube.

The above-referenced U.S. patent discloses a transmission-type, scanning electron microscope in which a bright-field detector is disposed above the television camera tube and the output signal of the detector is transmitted to a second television monitor tube which is synchronized with the specimen scanning. The diffraction image and the bright-field image produced by the microscope can thus be observed simultaneously. The disadvantage of this arrangement, however, is that it is impossible to generate a dark-field image using such a system.

SUMMARY OF THE INVENTION

It is therefore an object of the present invention to overcome the aforementioned disadvantage of heretofore known prior art microscopes.

It is also an object of the present invention to provide an improved transmission-type, scanning charged-particle beam microscope for simultaneously displaying a diffraction image and a dark-field image of the specimen examined.

These and other objects of the invention are achieved in a transmission-type, scanning charged-particle beam microscope including a television camera tube and a television display tube for generating and displaying a diffraction image of a specimen to be examined. The improvement comprises a transparent fluorescent screen disposed in the ray cone of the beam behind the specimen along the beam path in the microscope, light-optical means adapted for imaging the fluorescent screen on a target of the television camera tube, and detector means for integrally detecting radiation emanating from the fluorescent screen.

By providing a transparent fluorescent screen disposed between the specimen and the television camera tube, the dark-field image produced by the microscope can be detected in addition to the diffraction image. The fluorescent screen first converts the electron-optical diffraction image into a light-optical image and the latter is then imaged by means of a light-optical system on the target of the television camera tube. At the same time, the radiation emanating from the fluorescent screen is integrally detected by a detector which generates a signal from which the dark-field image is generated.

Either one of two different detectors may be utilized according to the improvement of the invention. Thus, in one embodiment of the invention the detector means has a sensitivity which lies within the optical range of the radiation emanating from the fluorescent screen. In another embodiment of the invention, the detector means has a sensitivity which lies within the range of secondary charged particles released at the fluorescent screen.

In accordance with the first-described embodiment of the invention, the detector means comprises light-sensitive detector means and the fluorescent screen is vertically inclined upwardly toward the axis of the microscope and has the rear side thereof along the beam path coupled to the light-sensitive detector means. The front side of the fluorescent screen along the beam path is imaged by the light-optical means on the target of the television camera tube. In this embodiment of the invention, the light-optical means may include a deflection mirror.

In the second embodiment of the invention, the television camera tube is disposed outside the microscope axis and the light-optical means includes a deflection mirror. This permits the television monitor tube to be located outside the evacuated microscope housing space, for example, at a window structure. In addition, the space below the fluorescent screen in the microscope remains free for the installation of additional equipment.

In the described embodiments of the invention, either the deflection mirror or the detector means is disposed behind the fluorescent screen along the beam path and the fluorescent screen and either the mirror or the detector means, depending on which embodiment is utilized, each include an aperture concentrically disposed therein about the microscope axis. The microscope further comprises a beam energy analyzer which is disposed behind the deflection mirror or the detector means along the beam path. The charged particles of the beam pass through the apertures and strike the energy analyzer. The advantage afforded by this arrangement is that it is possible to either display, additionally or also simultaneously, a bright-field image or to perform an energy loss analysis, in addition to simultaneously displaying a diffraction and a dark-field image.

In order to obtain a perfect dark-field image in both embodiments of the invention, the primary beam, i.e., the bright-field image, must be suppressed. The simplest way to suppress the primary beam would be to utilize a diaphragm disposed in the ray path of the beam in front of the fluorescent screen having a size which is equal to the size of the primary beam cone. It is, however, preferable to utilize a bright-field detector instead of such a diaphragm since the detector enables the bright-field image to be displayed either simultaneously or selectively in addition to the dark-field image and the diffraction image. For simultaneous display, an additional television monitor tube would be required.

The improvement according to the invention permits optimum information regarding the specimen examined to be obtained, and, due to the simultaneous registration of the different kinds of information, results in short exposure times and, thus, minimum damage to and little contamination of the specimen examined. A better correlation between the picture and the diffraction image produced also results. Thus, for example, in crystallographic investigations, the boundary between two crystal zones of different crystal orientation, the so-called "grain boundary", can be localized simply and accurately. The diffraction image changes abruptly if the grain boundary is traversed.

In a further embodiment of the invention, the microscope may further comprise image intensifier means disposed between the fluorescent screen and the television camera tube.

These and other novel features and advantages of the invention will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figure 1:
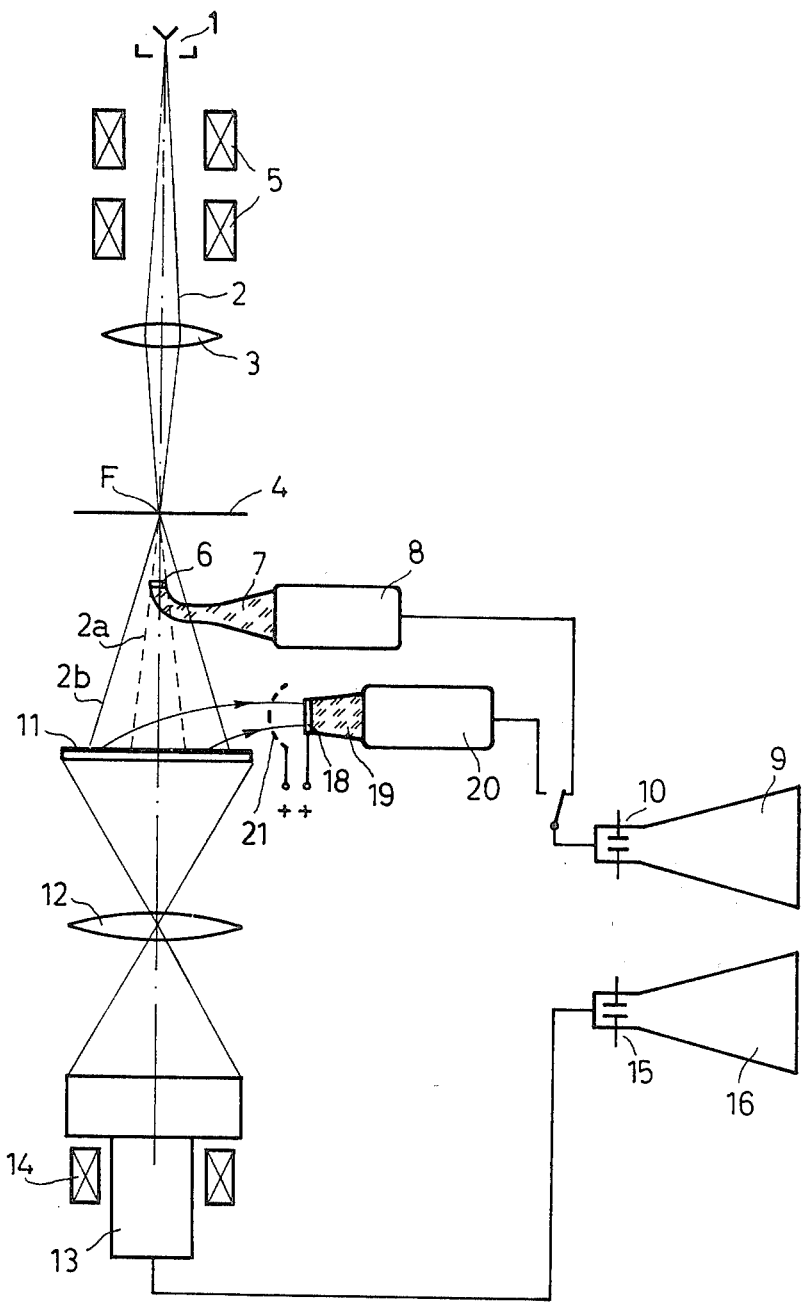
FIG. 1 is a schematic illustration of one embodiment of an improved transmission-type, scanning charged-particle beam microscope constructed according to the present invention.

Referring now to the drawings, in particular to FIG. 1, there is shown a transmission-type, scanning electron microscope including an electron source 1 which may comprise, for example, a field emission cathode. The electron source generates a beam 2 of electrons which is focussed on a specimen 4 by an objective lens 3 disposed below the beam source. A deflection system 5 is disposed between the beam source and the objective lens for deflecting the electron beam so that the focus F of the beam describes a raster on specimen 4. After the beam passes through specimen 4, it forms a primary ray cone 2a and a scatter-ray cone 2b. A detector means comprising a scintillation detector 6 is disposed behind specimen 4 along the beam path in primary ray cone 2a. The detector means includes a curved light guide 7 coupled to the scintillation detector and a photoelectron multiplier 8 coupled to the curved light guide. A television monitor tube 9 is coupled to photoelectron multiplier 8 so that the multiplier controls the brightness of the tube. The deflection system 10 of tube 9 is operated synchronously with deflection system 5 of the microscope. A bright-field image of specimen 4 is produced on television monitor tube 9. The radiation in scatter-ray cone 2b, which passes scintillation detector 6 by, strikes a transparent fluorescent screen 11 disposed behind specimen 4 and the scintillation detector along the beam path. The electron radiation striking the screen is converted into light. However, secondary electrons are simultaneously released at the surface of fluorescent screen 11.

A lens 12 is disposed behind screen 11 along the beam path for imaging the rear side of screen 11 along the beam path on a target of a television camera tube 13 disposed below lens 12. This camera tube includes a deflection system 14 which is synchronously operated with the deflection system 15 of a second television monitor tube 16 coupled to the camera tube. The output signals generated by the television camera tube 13 control the brightness of television monitor tube 16. The diffraction image of the illuminated specimen area is, thus, displayed on television monitor tube 16.

The secondary electrons released at fluorescent screen 11 are deflected by a suction voltage applied to a suction grid 21 and are accelerated in the direction toward another scintillation detector 18 disposed outside the beam path adjacent the scatter ray cone 2b between photoelectron multiplier 8 and the fluorescent screen. The suction voltage is small compared to the acceleration voltage for the primary electrons so that the latter are almost not deflected thereby. Scintillation detector 18 is coupled by means of a light guide 19 to another photoelectron multiplier 20. The output signal generated by multiplier 20 is the amplified dark-field signal which can be again used for the bright or dark modulation of a television monitor tube. In the embodiment of the invention illustrated in FIG. 1, the bright-field or the dark-field signal can be applied to television monitor tube 9 as desired by a switch coupling the monitor tube to the photoelectron multipliers. It is, of course, also possible to utilize another television monitor tube so that the bright-field and the dark-field image can be displayed simultaneously in addition to the diffraction image.

Figure 2:
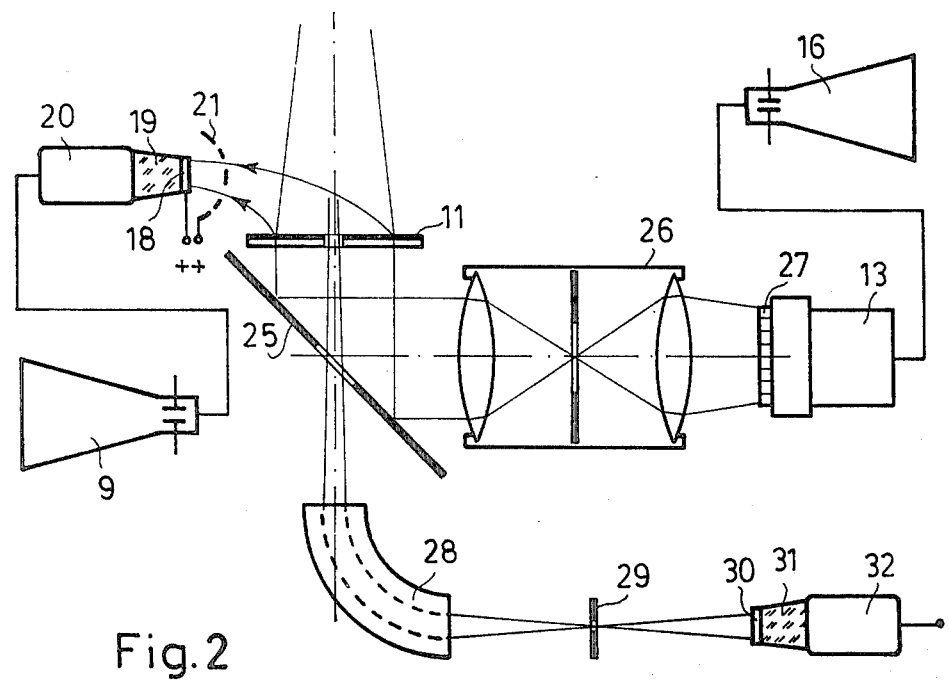
FIG. 2 is a partial schematic illustration of another embodiment of an improved charged-particle beam microscope constructed according to the present invention.

FIG. 2 illustrates another embodiment of the invention which is similar to that shown in FIG. 1 in that the suction grid 21 is disposed above fluorescent screen 11 outside the scatter-ray cone 2b along with light guide 19 and photoelectron multiplier 20. This embodiment of the invention is different from FIG. 1, however, in that the rear side of the fluorescent screen 11 along the beam path is imaged on an image intensifier 27 by means of a deflection mirror 25 and a tandem lens 26. The image amplifier 27 transmits the light to the target of television camera tube 13 which generates an output signal which is transmitted to television monitor tube 16 for the pictorial display of the diffraction image.

Both the fluorescent screen and the deflection mirror 25 are provided with an aperture in this embodiment of the invention which is concentrically disposed therein about the microscope axis. A beam energy analyzer 28 is disposed beneath deflection mirror 25 along the beam path on the microscope axis. The apertures permit the electrons of the beam to pass through the fluorescent screen and the deflection mirror and strike the energy analyzer. Thus, it is possible to perform an energy loss analysis as well as to simultaneously display the diffraction image and the dark-field image. The energy analyzer 28 generates an output signal which is transmitted by a slit 29 to a scintillation detector 30. A light guide 31 is coupled to the scintillation detector and transmits the detected signal to a photoelectron multiplier 32. For a given excitation of energy analyzer 28, the output signal generated by photoelectron multiplier 32 represents the bright-field signal which can again be displayed on a television monitor tube as a bright-field image. Thus, in this embodiment of the invention, it is possible to view, as desired, the diffraction image and the dark-field image simultaneously with the bright-field image, or to perform an energy loss analysis.

Figure 3:
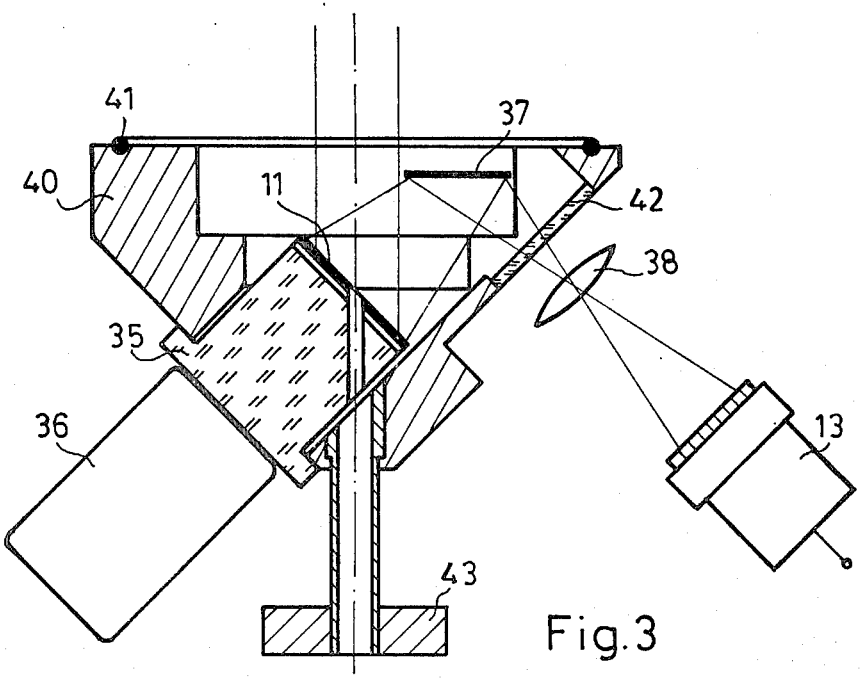
FIG. 3 is a partial schematic illustration of still another embodiment of an improved charged-particle beam microscope constructed according to the present invention.

The embodiment of the invention illustrated in FIG. 3 is a particularly space-saving design. In this embodiment of the invention, the electron beam emanating from the specimen again strikes fluorescent screen 11. In accordance with this embodiment of the invention, the fluorescent screen is inclined at an angle of 45° vertically upwardly towards the axis of the microscope. The light emitted on the rear side of the fluorescent screen along the beam path is conducted by means of a light guide 35 to a photoelectron multiplier 36. It should be noted that instead of the photoelectron multiplier, any other integrating, light-sensitive component can be utilized. The fluorescent screen 11 and light guide 35 also have apertures concentrically disposed therein about the microscope axis which, similar to the embodiment of the invention illustrated in FIG. 2, permit electrons travelling near the axis to strike an energy analyzer disposed on the microscope axis behind the light guide (not shown in FIG. 3). Light guide 35 may be solid, but may also be constructed from a bundle of light-conducting fibers disposed about the aperture in the light guide. The front side of fluorescent screen 11 is again imaged by means of a deflection mirror 37 and a light-optical system 38 on the target of television camera tube 13. The output signal of the television camera tube again furnishes the diffraction image.

In the embodiment of the invention illustrated in FIG. 3, fluorescent screen 11 and the adjacent light guide 35 and deflection mirror 37 are disposed in a compact housing structure 40 which can be fastened by means of gaskets 41 in a vacuum-tight manner to the microscope column. A window 42 provides a vacuum seal between the deflection mirror 37 and the light-optical system 38, the latter of which is disposed outside the vacuum portion of the microscope housing with television camera tube 13. The energy analyzer used in this embodiment of the invention can be coupled to the housing structure 40 by means of flange 43.

In the embodiment of the invention illustrated in FIG. 3, the dark-field signal is also obtained by light emanating from the fluorescent screen and not by means of secondary electrons, in contrast to the embodiments of the invention illustrated in FIGS. 1 and 2. In all three embodiments of the invention, however, the radiation emanating from one side of the fluorescent screen is used to generate the diffraction image and the radiation emanating from the opposite side of the screen to generate the dark-field image. It is, however, possible to use only the radiation emanating from one side of the fluorescent screen to obtain both signals. For example, the rear side of the fluorescent screen may be imaged by means of a semi-transparent mirror, first on the television camera tube and secondly on an integrating light-sensitive device. Such an arrangement, however, always produces a halving of the intensity of the individual signals. Thus, for this reason the other described embodiments of the invention are preferably utilized.

In each of the embodiments of the invention illustrated, the described light-optical system utilized for imaging the fluorescent screen on the target of the television camera tube is shown as a lens system. Such imaging can, however, also be realized by utilizing fiber optics, particularly in the embodiment of the invention illustrated in FIG. 1. It should also be noted that the invention is not limited to use in transmission-type, scanning, electron microscopes but may also be utilized in the same manner in transmission-type, scanning ion microscopes.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a transmission-type, scanning, charged-particle beam microscope including a television camera tube and a television display tube for generating and displaying a diffraction image of a specimen to be examined, said beam comprising a primary ray cone and a scatter-ray cone which generate a bright-field image and a dark-field image of said specimen, respectively, said microscope further comprising means for detecting a bright-field image of said specimen generated by said beam, the improvement comprising,
a transparent fluorescent screen disposed behind said specimen along the beam path in said microscope;
means adapted to prevent said primary ray cone from striking said screen;
light-optical means adapted for imaging said fluorescent screen on a target of said television camera tube and thereby detecting a diffraction image of said specimen generated by said beam; and
detector means disposed adjacent said fluorescent screen for detecting radiation emitted by said fluorescent screen when said scatter-ray cone of said beam strikes said screen and thereby a dark-field image of said specimen generated by said beam.

2. The improvement recited in claim 1, wherein said detector means comprises means for detecting optical radiation which is emitted from said fluorescent screen when said scatter-ray cone of said beam strikes said screen.

3. The improvement recited in claim 1, wherein said detector means comprises means for detecting secondary charged particle radiation released at said fluorescent screen when said scatter-ray cone of said beam strikes said screen.

4. The improvement recited in claim 2, wherein said detector means comprises light-sensitive detector means, and wherein said fluorescent screen is vertically inclined upwardly toward the axis of said microscope and has the rear side thereof along the beam path coupled to said light-sensitive detector means, the front side of said fluorescent screen along said beam path being imaged by said light-optical means on said target of said television camera tube.

5. The improvement recited in claim 4, wherein said light-optical means includes a deflection mirror.

6. The improvement recited in claim 1, wherein said television camera tube is disposed outside the microscope axis and wherein said light-optical means includes a deflection mirror.

7. The improvement recited in claim 6, wherein said deflection mirror is disposed behind said fluorescent screen along the beam path and wherein said fluorescent screen and said deflection mirror each include an aperture concentrically disposed therein about said microscope axis, said screen aperture being adapted for preventing said primary ray cone of said beam from striking said screen, said microscope further comprising a beam energy analyzer disposed behind said deflection mirror along the beam path, said charged particles of said primary ray cone of said beam passing through said apertures and striking said energy analyzer.

8. The improvement recited in claim 6, wherein said detector means is disposed behind said fluorescent screen along the beam path and wherein said fluorescent screen and said detector means each include an aperture concentrically disposed therein about said microscope axis, said screen aperture being adapted for preventing said primary ray cone of said beam from striking said screen, said microscope further comprising a beam energy analyzer disposed behind said detector means along the beam path of said microscope axis, said charged particles of said primary ray cone of said beam passing through said apertures and striking said energy analyzer.

9. The improvement recited in claim 1, further comprising image intensifier means disposed between said fluorescent screen and said television camera tube.

* * * * *